US011503699B2

(12) United States Patent
Niu et al.

(10) Patent No.: US 11,503,699 B2
(45) Date of Patent: Nov. 15, 2022

(54) SINGLE PCB BOARD CAMERA WITH ENHANCED SIGNAL INTEGRITY AND THERMAL CONDUCTION

(71) Applicant: Pony AI Inc., Grand Cayman (KY)

(72) Inventors: Li Niu, San Jose, CA (US); Hanxiao Xie, Fremont, CA (US); Bin Han, Fremont, CA (US); Zaichang Zhao, Fremont, CA (US); Jordan Renovato Bravo, Santa Clara, CA (US)

(73) Assignee: Pony AI Inc., Grand Cayman (KY)

( * ) Notice: Subject to any disclaimer, the term of this patent is extended or adjusted under 35 U.S.C. 154(b) by 230 days.

(21) Appl. No.: 17/026,149

(22) Filed: Sep. 18, 2020

(65) Prior Publication Data

US 2022/0095448 A1      Mar. 24, 2022

(51) Int. Cl.
*H04N 5/225* (2006.01)
*H05K 1/02* (2006.01)
*H05K 1/18* (2006.01)
*H05K 7/14* (2006.01)

(52) U.S. Cl.
CPC ......... *H05K 1/0204* (2013.01); *H04N 5/2252* (2013.01); *H05K 1/181* (2013.01); *H05K 7/1417* (2013.01); *H04N 5/22521* (2018.08); *H05K 2201/10151* (2013.01)

(58) Field of Classification Search
CPC .................................................... H04N 5/2252
USPC ........................................................ 348/375
See application file for complete search history.

(56) References Cited

U.S. PATENT DOCUMENTS

| | | | |
|---|---|---|---|
| 8,178,395 B2 | 5/2012 | Lin et al. | |
| 8,310,067 B2 | 11/2012 | Zhao et al. | |
| 10,756,000 B2 | 8/2020 | Jin et al. | |
| 2018/0175491 A1* | 6/2018 | DeMersseman | H04N 5/2257 |
| 2019/0124243 A1* | 4/2019 | Mleczko | B60R 11/04 |

\* cited by examiner

*Primary Examiner* — Joel W Fosselman
(74) *Attorney, Agent, or Firm* — Sheppard Mullin Richter & Hampton LLP

(57) ABSTRACT

Described herein is a sensor device. The sensor device comprises a housing and a printed circuit board encased by the housing. The printed circuit board comprises an image sensor that captures image data, an image sensor processor that processes the image data, a serializer that converts one or more data channels associated with the image data into a single data channel, and one or more exposed surfaces. The one or more exposed surfaces dissipate heat generated by the image sensor, the image sensor processor, and the serializer from the printed circuit board to the housing.

15 Claims, 12 Drawing Sheets

SINGLE PCB BOARD CAMERA WITH ENHANCED SIGNAL INTEGRITY AND THERMAL CONDUCTION

BACKGROUND

A vehicle such as an autonomous or semi-autonomous vehicle can include a myriad of sensors that provide continuous streams of sensor data captured from a surrounding environment of the vehicle. For example, an autonomous or semi-autonomous vehicle can include cameras, light detection and ranging (LiDAR) sensors, radars, Global Positioning System (GPS) devices, sonar-based sensors, ultrasonic sensors, accelerometers, gyroscopes, magnetometers, inertial measurement units (IMUs), and far infrared (FIR) sensors. Such sensor data can enable an autonomous vehicle to perform a number of driving functions that would otherwise be performed by a human operator. These driving functions can, for example, include various vehicle navigation tasks such as vehicle acceleration and deceleration, vehicle braking, vehicle lane changing, adaptive cruise control, blind spot detection, rear-end radar for collision warning or collision avoidance, park assisting, cross-traffic monitoring, emergency braking, and automated distance control.

SUMMARY

Described herein, in some embodiments, is a sensor device. The sensor device may comprise a housing and a printed circuit board encased by the housing. The printed circuit board may comprise an image sensor that captures image data, an image sensor processor that processes the image data, a serializer that converts one or more data channels associated with the image data into a single data channel, and one or more exposed surfaces. The one or more exposed surfaces may transfer heat generated by the image sensor, the image sensor processor, and the serializer from the printed circuit board to the housing. In some embodiments, the sensor device may comprise only a single printed circuit board.

In some embodiments, the housing comprises a front plate and a back plate, and the printed circuit board is secured to the front plate of the housing.

In some embodiments, the one or more exposed surfaces are disposed at each corner of the printed circuit board.

In some embodiments, each of the one or more exposed surfaces includes a through hole, the through hole being an installation hole.

In some embodiments, the printed circuit board is secured to a front plate of the housing through mechanical fasteners at the one or more exposed surfaces.

In some embodiments, at least one of the exposed surfaces include a second through hole, the second through hole being an alignment hole.

In some embodiments, the printed circuit board further comprises: a plurality of conducting layers that conduct signals associated with the image sensor, the image sensor processor, and the serializer; and a plurality of non-conducting layers disposed between the plurality of conducting layers, wherein the plurality of non-conducting layers insulate the plurality of conducting layers.

In some embodiments, the printed circuit board further comprises: a plurality of heat conducting channels disposed underneath the image sensor, the image sensor processor, and the serializer.

In some embodiments, the plurality of heat conducting channels comprise channels extending through a depth of the printed circuit board and penetrate through the plurality of conducting layers and the plurality of non-conducting layers.

In some embodiments, the plurality of heat conducting channels are insulated from the plurality of conducting layers.

In some embodiments, the plurality of heat conducting channels is coupled to a conducting layer of the plurality of conducting layers, and wherein the conducting layer is insulated from other conducting layers of the plurality of conducting layers.

In some embodiments, the conducting layer is coupled to the one or more exposed surfaces of the printed circuit board.

In some embodiments, the plurality of heat conducting channels comprise copper channels.

In some embodiments, the printed circuit board further comprises a thermal compound that transfers the heat generated by the image sensor, the image sensor processor, and the serializer from the printed circuit board to the housing.

In some embodiments, the thermal compound is applied to an underside of the printed circuit board at a location corresponding to the image sensor, the thermal compound making contact with a back plate of the housing.

In some embodiments, the thermal compound is applied to a top side of the image sensor processor, the thermal compound making contact with a front plate of the housing.

In some embodiments, the thermal compound is applied to a top side of the serializer, the thermal compound making contact with a front plate of the housing.

In some embodiments, the image sensor is disposed on the printed circuit board and: centered with respect to a central vertical axis that bisects a surface of the printed circuit board; and offset from a central horizontal axis that bisects the surface of the printed circuit board and is perpendicular to the central vertical axis.

In some embodiments, the image sensor processor is disposed on the printed circuit board and: centered with respect to a central horizontal axis that bisects the surface of the printed circuit board; and offset from a central vertical axis that bisects the surface of the printed circuit board and is perpendicular to the central horizontal axis.

In some embodiments, the serializer is disposed on the printed circuit board and: offset from a central vertical axis that bisects a surface of the printed circuit board; and offset from a central horizontal axis that bisects a surface of the printed circuit board and is perpendicular to the central vertical axis.

Various embodiments of the present disclosure provide a method implemented by a system as described above.

These and other features of the apparatuses, systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

DETAILED DESCRIPTION

Figure 1A:
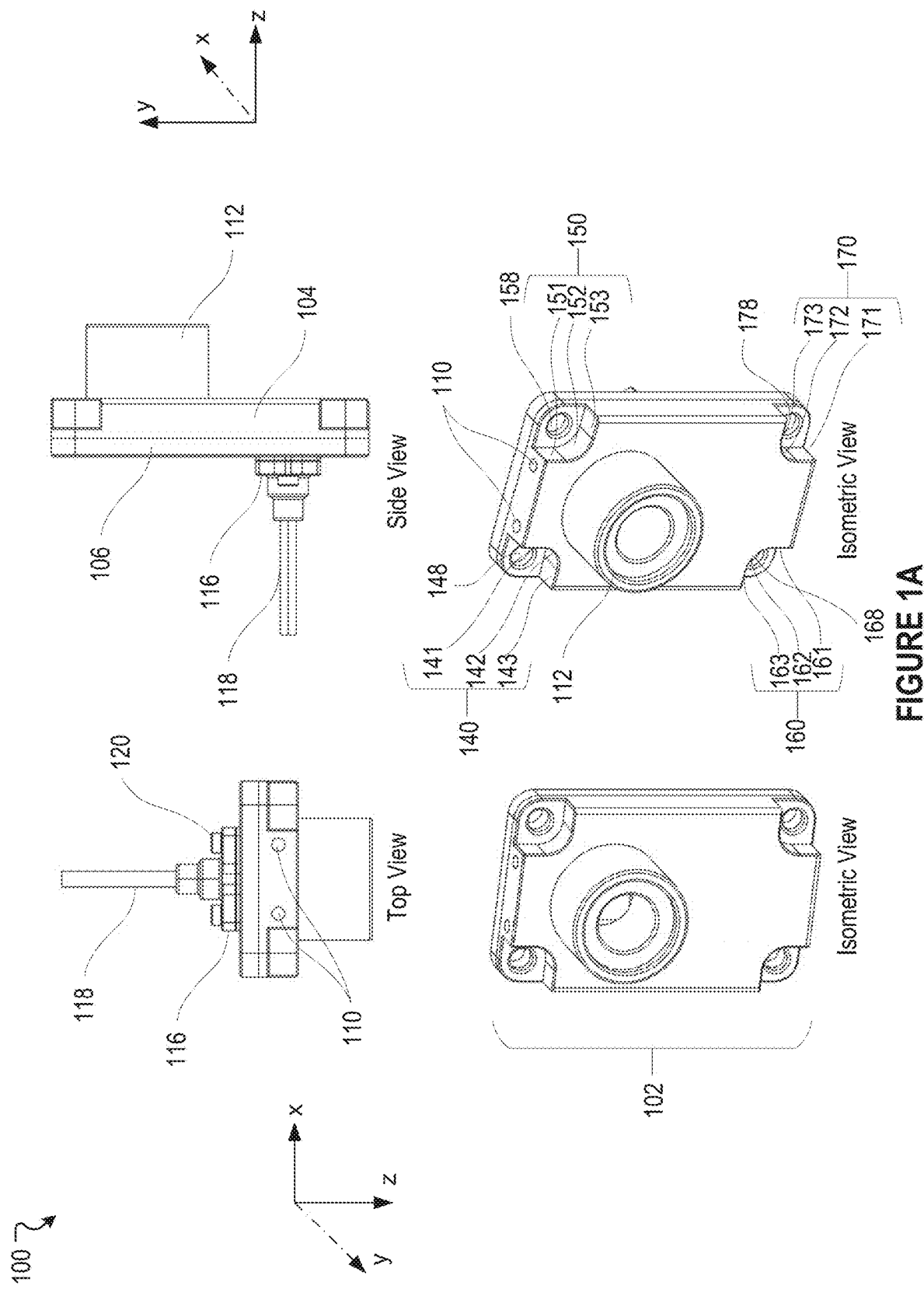
FIGS. 1A-1B illustrate a camera in accordance with various embodiments of the present inventions.

Cameras used in autonomous applications, such as in autonomous vehicles, generally have a stacked printed circuit board (PCB) architecture. In cameras with a stacked PCB architecture, circuit boards of similar sizes and dimensions are arranged adjacent to one another in a camera housing. Drawbacks of implementing a stacked PCB architecture include compromised thermal conductivity, mechanical stability, and signal integrity. In cameras with a stacked PCB architecture, because circuit boards are arranged adjacent to one another, heat generated by electronic components such as sensors and processors on the circuit boards needs to be transferred or dissipated from one circuit board to a next circuit board until the heat reaches a heat sink. Such a heat dissipation scheme may not be ideal because heat dissipation through circuit boards is not thermally efficient. Another drawback is alignment performance. Cameras with a stacked PCB architecture generally lack integrated mount points that allow the cameras to be directly secured or installed to a surface such as a structure of a vehicle. To do so, custom brackets or adapters are needed to secure the cameras to the surface. Under this configuration, the cameras held in place by the custom brackets may become loose over time and shift from their original secured or installed locations, thereby causing camera misalignment. Yet another drawback is electrical performance. As mentioned above, in cameras with a stacked PCB architecture, circuit boards are arranged adjacent to one another. Thus, to allow communication between the circuit boards, interconnects are used. Interconnects are connectors with ribbon cables or wires that carry signals between the circuit boards. When signals travel or go through an interconnect, signal integrity and quality decrease. Therefore, for cameras with a stacked PCB architecture, additional signal conditioning circuits may be needed to compensate for losses in signal integrity.

Described herein are solutions that address the problems discussed above. In various embodiments, the present inventions can include a camera designed for use in autonomous applications such as in autonomous vehicles or robotics. The camera can include a camera housing comprising a front plate and a back plate. A circuit board such as a printed circuit board or PCB associated with the camera can be housed within or encased by the camera housing between the front and back plates. By adapting a single PCB architecture, the present inventions avoid the electrical performance drawback described above by eliminating the need for interconnects. In some embodiments, the camera housing can include one or more mounting holes, one or more alignment holes, one or more adaptor holes, and a lens mount. The one or more mounting holes are through holes that can be used to secure or install the camera to a structure such as a sensor structure of an autonomous vehicle. For example, mechanical couplers or fasteners such as screws, nuts and bolts can be used to secure the camera to the structure through the one or more mounting holes. By integrating mounting holes into the camera housing, the present inventions eliminate the need for custom brackets to secure the camera, while ensuring that all six degrees of freedom are secured. The one or more alignment holes can aid in aligning the camera to the structure. For example, a sensor structure of an autonomous vehicle may have one or more alignment pins at a location corresponding to a camera alignment location. In this example, the camera can be aligned to the camera alignment location on the sensor structure by resting the one or more alignment holes of the camera onto the one or more alignment pins. In some cases, the one or more alignment holes can lock the camera in place and prevent the camera from shifting or drifting over time. For example, assume that screws holding down the camera to the sensor structure become loose over time. In this example, because the camera is installed to the sensor structure over the one or more alignment pins, the one or more alignment pins prevent the camera from shifting out of place. The one or more adaptor holes are threaded holes on which various enhancement apparatuses can be installed. The enhancement apparatuses can add additional capability or functionality to the camera. The lens mount is a protrusion that allows various lenses to be installed or mounted to the camera.

In some embodiments, the circuit board can include electronic components associated with the camera. The electronic components can be surface mounted and soldered onto specific locations on the circuit board. In some embodiments, the electronic components can include at least an image sensor to capture image data, an image sensor processor to process the image data, and a serializer to output the image data in a single data channel such as a high-speed data channel for processing. In some embodiments, the circuit board can include a plurality of heat conducting channels or thermal vias disposed underneath the electronic components. The thermal vias are metal channels within the circuit board that facilitate dissipation of heat generated by the electronic components by conducting the heat away from the electronic components. In some embodiments, the circuit board can further include one or more exposed surfaces at corners of the circuit board. The one or more exposed surfaces are coupled to the thermal vias. The one or more exposed surfaces can further dissipate the heat generated by the electronic components away from the circuit board to the camera housing. The present inventions are described in greater detail herein.

Figure 1B:
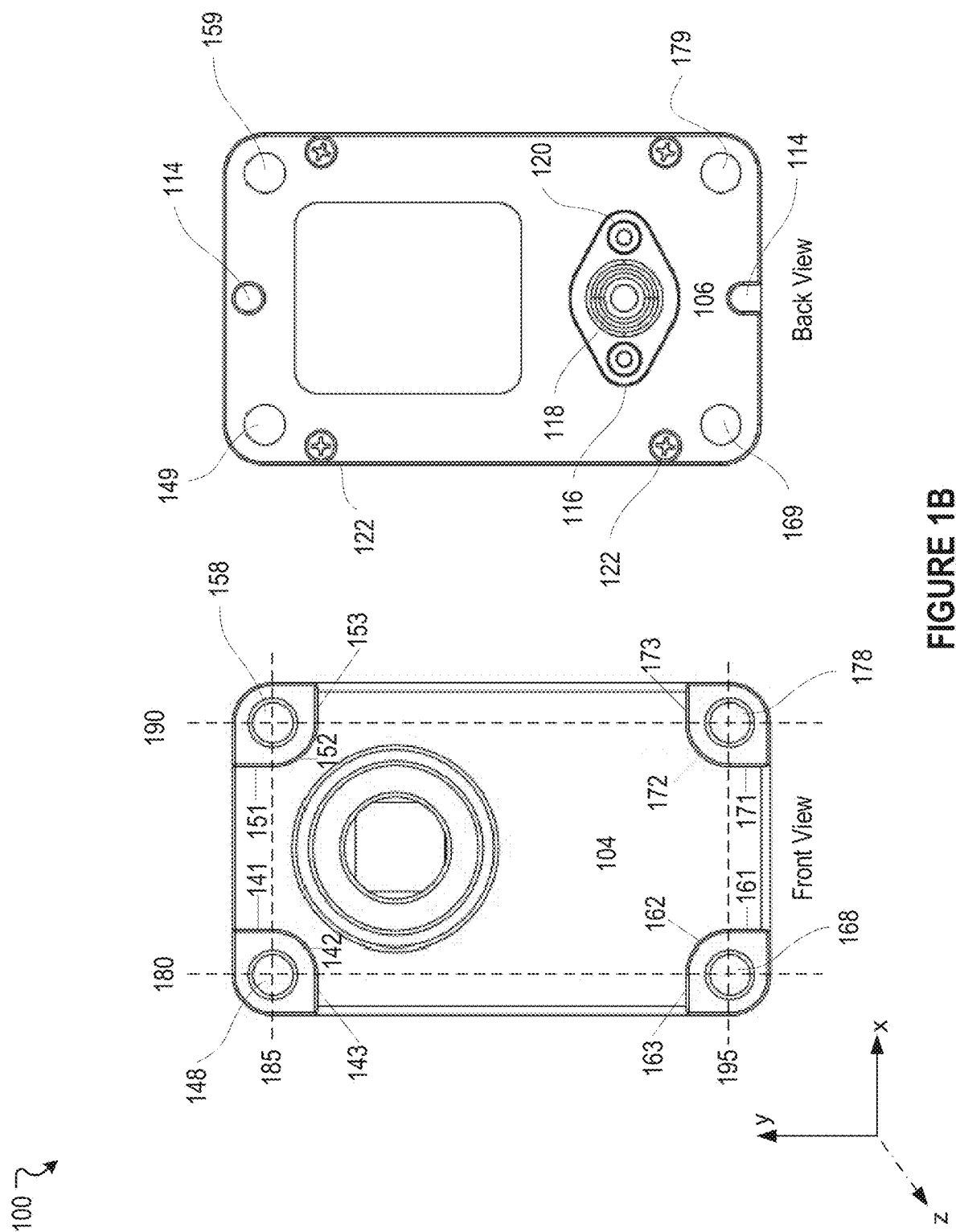

FIGS. 1A-1B illustrate a camera 100 in accordance with various embodiments of the present inventions. FIG. 1A provides a top view, a side view, and two isometric views of the camera 100. FIG. 1B provides a front view and a back view of the camera 100. In some embodiments, as shown in FIG. 1A, the camera 100 can include a camera housing 102 and a circuit board (not shown) housed within or encased by the camera housing 102. The camera housing 102 can be made from any suitable materials. For example, the camera housing 102 can be made from anodized aluminum, carbon steel, stainless steel, ceramic, plastic, or any other suitable materials that can provide mechanical, structural, and/or environmental protection to the circuit board. The camera housing 102 can be fabricated using various fabrication technologies including but not limited to three-dimensional (3D) printing technologies.

In some embodiments, the camera housing 102 can comprise a front plate 104 and a back plate 106. The front plate 104 can include one or more mounting holes 148, 158, 168, and 178 and the back plate 106 can include one or more mounting holes 149, 159, 169, and 179, through which the camera 100 can be mounted. For example, the camera 100 can be secured or installed to a structure using mechanical couplers such as screws or nuts and bolts through the one or more mounting holes 148, 158, 168, 178, 149, 159, 169, and 179. The one or more mounting holes 148, 158, 168, 178, 149, 159, 169, and 179 can be through holes that are disposed near corners of the front plate 104 and the back plate 106 at same respective locations. In this way, when the front plate 104 and the back plate 106 are assembled into the camera housing 102, pairs of the one or more mounting holes such as 148 and 149, 158 and 159, 168 and 169, and 178 and 179 match up or line up between the front plate 104 and the back plate 106. In some embodiments, the camera housing 102 can include a camera housing gasket which may be implemented as the camera housing gasket 364 of FIG. 3C. The camera housing gasket can be disposed between the front plate 104 and the back plate 106. In one implementation, the camera housing gasket can be a rubber gasket that can fill spacings or gaps between the front plate 104 and the back plate 106. The camera housing gasket can prevent debris such as water, rain, or dust from entering the camera housing 102 and contaminating the circuit board thereafter.

In some embodiments, as shown in FIGS. 1A-1B, the front plate 104 may comprise indentations 140, 150, 160, and 170 that penetrate or extend into portions of the front plate 104 in a minus z direction of the z-axis shown in FIG. 1A with respect to the top view of the camera 100. In some embodiments, each of the indentations 140, 150, 160, and 170 may extend into more than half of the thickness of the front plate 104 in the minus z direction. After the indentations 140, 150, 160, and 170 terminate at a plane parallel to the x-y plane along the minus z direction of the z-axis, the one or more mounting holes 148, 158, 168, and 178 may extend through an entire remaining portion of a thickness of the front plate 104 in along the z-axis. The indentations 140, 150, 160, and 170 may be disposed near corners of the front plate 104. In some embodiments, each of the indentations 140, 150, 160, and 170 may include a semicircular region (e.g., 142, 152, 162, and 172, respectively) flanked by or adjacent to two planar or flat regions (e.g., 141 and 143, 151 and 153, 161 and 163, and 171 and 173, respectively). In some embodiments, as shown in FIG. 1B, a y-coordinate of a junction or intersection between the semicircular region 142 and the flat region 141 of the indentation 140 may match a y-coordinate of a center of the mounting holes 148 and 158. A x-coordinate of a junction or intersection between the semicircular region 142 and the flat region 143 of the indentation 140 may match a x-coordinate of a center of the mounting holes 148 and 168. In other words, the semicircular region 142 may terminate at locations aligned with and offset from the center of the mounting hole 148. Thus, each semicircular region 142, 152, 162, and 172 may terminate at locations where the semicircular regions 142, 152, 162, and 172 intersect planes or axes connecting centers of the mounting holes 148, 158, 168, and 178. As an illustrative example, the semicircular region 142 disposed near a top left corner of the front plate 104 may terminate at a first location where the semicircular region 142 intersects a plane or an axis 185 connecting the centers of the mounting holes 148 and 158 disposed near a top of the front plate 104. The semicircular region 142 may terminate at a second location where the semicircular region 142 intersects a plane or axis 180 connecting the centers of the mounting holes 148 and 168 disposed near a left side of the front plate 104. The semicircular region 152 disposed along a top right corner of the front plate 104 may terminate at a first location where the semicircular region 152 intersects the plane or the axis 185 connecting the centers of the mounting holes 148 and 158 disposed near at a top side of the front plate 104. The semicircular region 152 may terminate at a second location where the semicircular region 152 intersects a plane or axis 190 connecting the centers of the mounting holes 158 and 178 disposed along a right side of the front plate 104. The semicircular region 168 disposed near a bottom left corner of the front plate 104 may terminate at a first location where the semicircular region 168 intersects a plane or the axis 195 connecting the centers of the mounting holes 168 and 178 disposed along a bottom side of the front plate 104. The semicircular region 168 may terminate at a second location where the semicircular region 168 intersects the plane or axis 180 connecting the centers of the mounting holes 148 and 168. The semicircular region 178 disposed near a bottom right corner of the front plate 104 may terminate at a first location where the semicircular region 178 intersects the plane or the axis 195 connecting the centers of the mounting holes 168 and 178 disposed along a bottom of the front plate 104. The semicircular region 178 may terminate at a second location where the semicircular region 178 intersects the plane or axis 190 connecting the centers of two mounting holes 158 and 178.

In some embodiments, the front plate 104 can include one or more adaptor holes 110 and a lens mount 112. The one or more adaptor holes 110 can be threaded screw holes disposed on a flat surface at or near the top side of the front plate 104 on which various enhancement apparatuses, such as the enhancement apparatus 506 of FIG. 5, can be installed or mounted. The enhancement apparatuses can add additional capability or functionality to the camera 100. For example, a lens cleaning apparatus such as a high pressure air stream, a wiper, or a cleaning solution dispenser can be mounted to the camera 100 through the one or more adaptor holes 110 to clean a lens surface of the camera 100. As another example, a neural filter apparatus can be mount to the camera 100 through the one or more adaptor holes 110 to alter transmittance of light seen by the camera 100. Many variations are possible.

In some embodiments, the lens mount 112 can be a circular protrusion extending outwards from a front surface of the front plate 104. The lens mount 112 can include a threaded hole on which various types of lenses can be installed. For example, a telephoto lens, a wide-angle lens, or a zoom lens can be screwed onto the lens mount 112 to change a focal length associated with the camera 100. In some embodiments, the lens mount 112 can include a lens mount gasket that seals spacings or gaps between the lens mount 112 and a lens installed onto the lens mount 112. The lens mount gasket can prevent debris such as water, rain, or dust from entering the camera housing 102 and contaminating the circuit board thereafter. Additional features associated with the front plate 104 will be discussed in greater detail in reference to FIG. 3B below.

Figure 5:
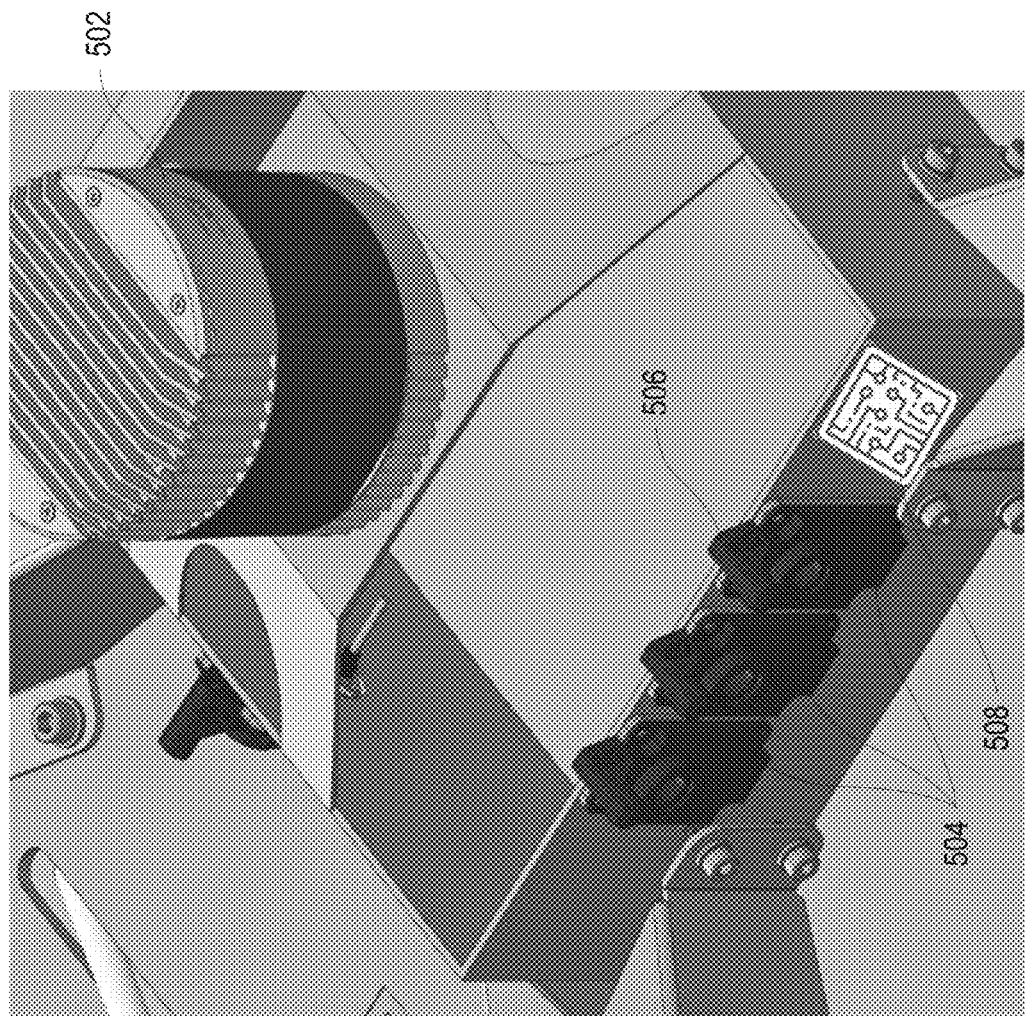
FIG. 5 illustrates a sensor structure of an autonomous vehicle in accordance with various embodiments of the present inventions.

In some embodiments, as shown in FIGS. 1A-1B, the back plate 106 can include one or more alignment holes 114, a connector plate 116, and an electrical cable 118, which may include a pigtail coupled or connected to the connector plate 116. The one or more alignment holes 114 or dowel holes can aid in aligning the camera 100 to a structure. For example, a sensor structure of a vehicle, as shown in FIG. 5, can include one or more protruding alignments pins at a certain location on which the camera 100 is intended to be installed. In this example, the camera 100 can be aligned to the sensor structure by resting the one or more alignment holes 114 onto the one or more protruding alignment pins prior to securing the camera 100 to the sensor structure through the one or more mounting holes 148, 158, 168, and 178, and/or 149, 159, 169, and 179. The one or more alignment holes 114 thus ensure that the camera 100 will be installed at its intended location without additional alignment. In some cases, the one or more alignment holes 114 can improve alignment stability of the camera 100. For example, the one or more alignment holes 114 can improve alignment stability by preventing the camera 100 from shifting or drifting out of place once installed. In some embodiments, the one or more alignment holes 114 or dowel holes may be 3 mm in diameter. In some embodiments, the one or more mounting holes 148, 158, 168, and 178 may be fitted with M4 screws. As shown in FIGS. 1A-1B, the one or more mounting holes 148, 158, 168, and 178 can include four holes and the one or more alignment holes 114 can include two holes. Thus, a number of the one or more mounting holes 148, 158, 168, and 178 may exceed a number of the one or more alignment holes 114. In general, there can be any number of mounting holes and alignment holes. For example, in some embodiments, the number of the one more alignment holes 114 may exceed the number of the one or more mounting holes 148, 158, 168, and 178. Many variations are possible.

Figure 1C:
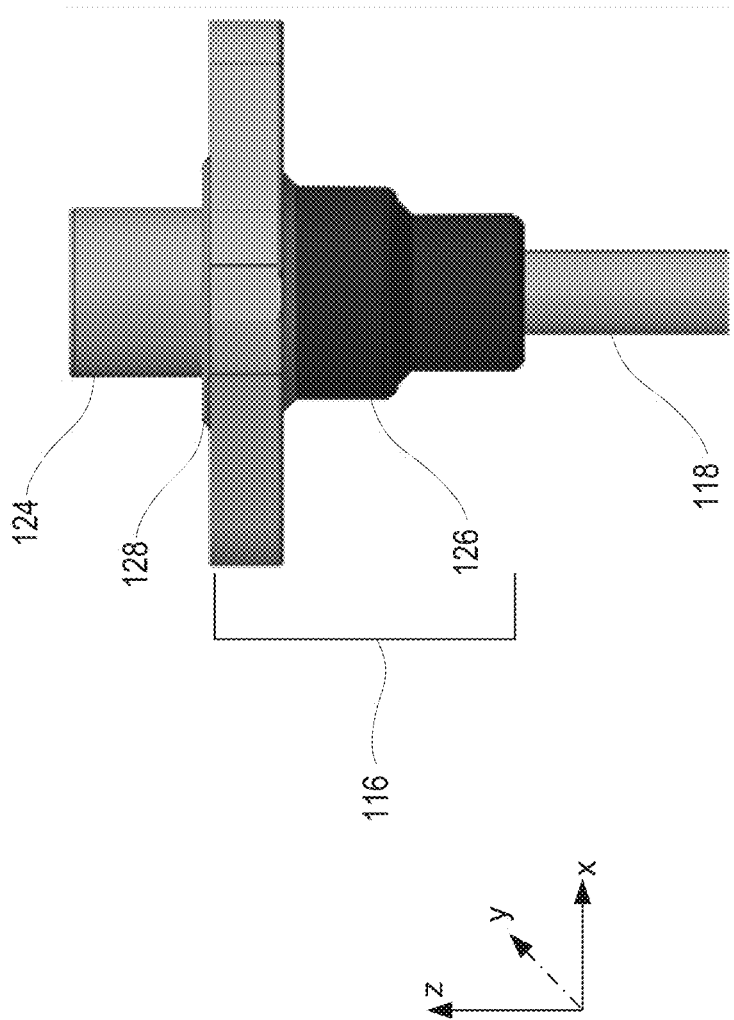
FIG. 1C illustrates a connector plate of the camera in accordance with various embodiments of the present inventions.

In some embodiments, the connector plate 116 can be a diamond shaped plate with rounded apexes. The connector plate 116 can electrically couple or connect the electrical cable 118 to the circuit board encased by the camera housing 102. The connector plate 116 can be secured or installed to the back plate 106 using one or more hexagonal head screws 120 such as Allen screws. In some embodiments, a connector plate gasket 128, as shown in FIG. 1C, can be disposed between the connector plate 116 and the back plate 106, and fastened or secured between the connector plate 116 and the back plate 106. Similar to the camera housing gasket 364, in one implementation, the connector plate gasket 128 can be a rubber gasket that can fill spacings or gaps between the connector plate 116 and the back plate 106. The connector plate gasket 128 can prevent debris such as water, rain, or dust, from entering the camera housing 102 through the back plate 106 and contaminating the circuit board thereafter.

In some embodiments, the electrical cable 118 can be a coaxial cable, such as a Power over Coax (PoC) cable that transmits image data associated with the camera 100 to an image processing module for processing. In some embodiments, the electrical cable 118 may comprise high-speed data transmission lines and power lines. For example, in some embodiments, the electrical cable 118 may include a plurality of sets of twisted pair wires. At least a first set of twisted pair wires may transmit power needed to power circuit board of the camera 100 and a second set twisted pair wire may transmit signal data. In this example, the second set of twisted pair wires may have a wire gauge higher than that of the first twisted pair. In general, each of the plurality of sets of twisted pair wires may be individually shielded from electromagnetic interference (EMI), radio frequency interference (RFI), and electrostatic interference (ESI) using an electric sleeve or braid grounded to a connector of the electrical cable. In one example, the electric sleeve or braid may include tin-plated, silver-plated, or nickel-plated copper foil and glass fibers. In another example, the electric sleeve or braid may include a combination of aluminum and polyester or aluminum and Kapton. In another example, the electric sleeve or braid may include a laminate foil having an aluminum, a polyester, and a second aluminum layer, along with a tinned copper braid. In some embodiments, image data associated with the camera 100 may be transmitted utilizing communication protocols such as UART (Universal Asynchronous Reception and Transmission) and/or I2C (Inter-integrated-circuit). In some embodiments, the electrical cable 118 can carry power needed to power the circuit board of the camera 100. For example, the electrical cable 118 can carry power required to operate an image sensor on the circuit board. In some embodiments, as shown in FIG. 1B, the back plate 106 can be secured to the front plate 104 with one or more screws 122 such as Phillip head screws.

As illustrated in FIGS. 1A-1B, the camera 100 generally has a tall and slim profile. Such a profile may be preferable for over a more cubic or square profile associated with a camera with a stacked PCB architecture. In general, in autonomous vehicle applications, spaces along a width and a length of a vehicle are more limited than spaces along a height of the vehicle. For example, only a fixed number of cameras can be installed along a width dimension at a front or a back, and along a length dimension at sides of an autonomous vehicle, while more cameras can be installed along a height dimension of the autonomous vehicle by stacking the cameras on top of each other. Therefore, by adapting a tall and slim profile, more cameras can be installed to a front, a back, or sides of a vehicle than cameras with a stacked PCB architecture. Furthermore, such a profile allows cameras of the camera 100 type to be arranged tightly or compactly, thereby allowing the cameras to have similar field of views. Similar field of views may simplify camera alignment.

In some embodiments, the camera 100 may be sealed to an ingress protection (IP) standard using the camera housing gasket 364 and the connector plate gasket 128. For example the camera 100 may be water sealed to at least an IP67 standard, which certifies the camera 100 to survive, or be able to operate, when submerged in water at a depth of one meter for thirty minutes. In some embodiments, the design of the connector plate 116 may further help with IP certification. For example, by having the electrical cable 118 pigtailed directly to the connector plate 116 and sealed by adhesive, as shown in FIG. 1C, one connector can be eliminated from the camera housing 102. In this way, there is one less "opening" for dust, water, or other debris to enter the camera 100.

FIG. 1C illustrates the connector plate 116 of the camera 100 in accordance with various embodiments of the present inventions. In some embodiments, the connector plate 116 can include a grommet 126 that couples the electrical cable 118 to the connector plate 116. In various embodiments, the grommet 126 can be a circular rubber with a center opening through which the electrical cable 118 can be threaded. The grommet 126 can protect the electrical cable 118 from being damaged or frayed. For example, the grommet 126 can prevent the electrical cable 118 from rubbing against an orifice or an edge of the connector plate 116. In some embodiments, adhesives can be applied between the grommet 126 and the electrical cable 118 to seal off any spacing or gaps that may result as the electrical cable 118 is threaded through the center opening of the grommet 126. In some embodiments, the electrical cable 118 can be terminated to a connector 124. The connector 124, in some embodiments, can be a female connector complementary to a male connector. In this way, when the connector plate 116 is secured or installed to the back plate 106, the connector 124 can provide power to the circuit board and carry image data out from the circuit board.

Figure 2:
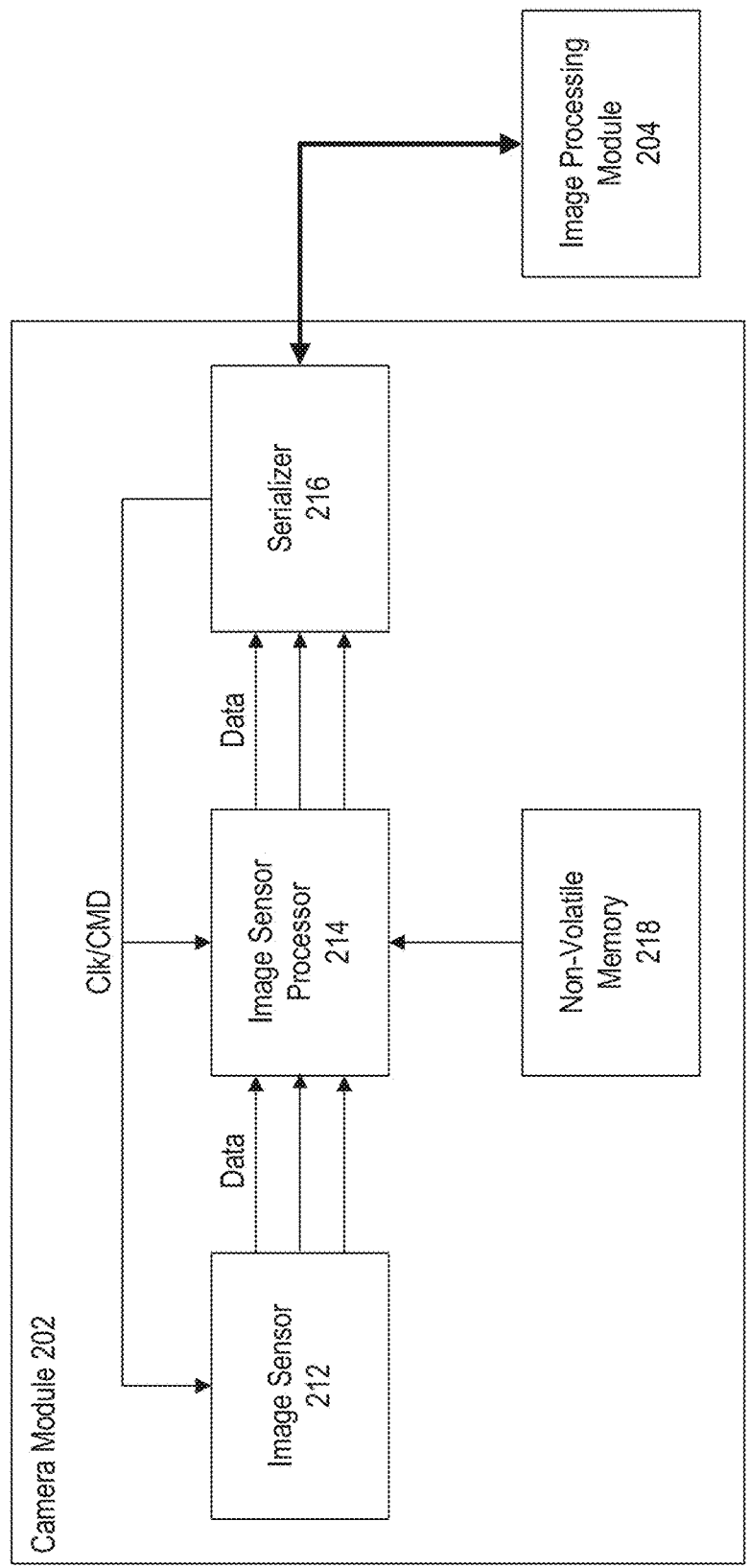
FIG. 2 illustrates a block diagram of a camera system in accordance with various embodiments of the present inventions.

FIG. 2 illustrates a block diagram of a camera system 200 in accordance with various embodiments of the present inventions. In some embodiments, the camera system 200 can include a camera module 202 and an image processing module 204. The camera module 202, in some embodiments, can be implemented with the camera 100 of FIGS. 1A-1B. The camera module 202 can be configured to capture image data from a surrounding environment. The image processing module 204 can be configured to process the image data captured by the camera module 202. For example, the image processing module 204 can perform object detection and/or recognition on the image data to identify objects captured by the image data. Once the objects are identified, the image processing module 204 can associate a tag with each identified object. For example, the image processing module 204 can associate a tag labeled "vehicle" with cars, trucks, etc. identified in the image data. As another example, the image processing module 204 associate a tag labeled "pedestrian" with people identified in the image data. As yet another example, the image processing module 204 can associate a tag labeled "traffic sign" with traffic lights, speed limits, etc. identified in the image data. Many variations are possible. In general, tags can be displayed or presented adjacent to identified objects when image data is later accessed.

In some embodiments, the image processing module 204 can highlight or outline objects identified in the image data. For example, the image processing module 204 can highlight a vehicle, pedestrian, or traffic sign identified in the image data by encapsulating the vehicle, pedestrian, or traffic sign with a rectangular or square box. In some cases, the rectangular or square box may be colored. For example, a rectangular box encapsulating a vehicle identified in the image data may be provided in red color. Many variations are possible.

In some embodiments, the camera module 202 can include an image sensor 212, an image sensor processor 214, a serializer 216, and a non-volatile memory 218. The image sensor 212, the image sensor processor 214, and the serializer 216, and the non-volatile memory 218 may be surface mounted or soldered onto the circuit board of the camera 100. The image sensor 212 can be a semiconductor device configured to capture photons (light) and convert the photons into a plurality of data channels such as data pipelines, and/or data lanes comprising image data. The image data comprises pixel data corresponding to pixels of the image sensor 212. In general, a pixel can be a circuit element of the image sensor 212 that converts photons it receives or captures in a given period of time into a corresponding electric charge such as a voltage. The photons captured by the image sensor 212 can be converted into the plurality of data channels by one or more analog-to-digital (A/D) converters associated with the image sensor 212. In some embodiments, the one or more A/D converters may be 8-bit A/D converters that convert photons into data channels of 256 discrete representations. In particular, each pixel data may be represented by 8-bit data of 256 discrete color levels) In some cases, the one or more A/D converters may be 16-bit A/D converters that convert photons into data channels of 65536 discrete representations. For example, each pixel data may be represented by 16-bit data of 65536 discrete color levels. In some cases, the one or more A/D converters may be 24-bit A/D converters that convert photons into data channels of over 16 million discrete representations. For example, each pixel data is represented by 24-bit data of over 16 million discrete color levels. Many variations are possible.

In some embodiments, the image sensor 212 can be implemented using a complementary metal oxide semiconductor (CMOS) sensor. In some cases, the image sensor 212 can be implemented using a charged coupled device (CCD) sensor. The image sensor 212 may have any suitable number of pixels. The number pixels indicate a resolution of the image sensor 212. In general, the more pixels an image sensor has, the more processing time is needed to process image data captured by the image sensor. For example, to reduce image processing time, an image sensor with a smaller pixel count may be preferred over an image sensor with a larger pixel count.

In some embodiments, the image sensor processor 214 can be configured to receive the plurality of data channels from the image sensor 212. The image sensor processor 214 can process the image data corresponding to the plurality of data channels prior to outputting the image data to the image processing module 204 for further processing. For example, in some embodiments, the image sensor processor 214 can perform high dynamic range (HDR) processing that combines multiple image exposures in the image data to form a HDR image. As another example, the image sensor processor 214 can perform motion compensation to reduce motion jitters or blurriness in the image data. As yet another example, the image sensor processor 214 can perform various noise reductions to improve image quality. The image sensor processor 214 may perform demosaicing, noise reduction, auto exposure, auto focus, auto white balance, and stabilizing the data, for example, by suppressing vibrations detected by gyro sensors. The non-volatile memory 218 can store instructions such as machine codes, binary codes that can instruct the image sensor processor 214 to perform the various processing discussed above. Once the image sensor processor 214 processes the image data, the image sensor processor 214 can output the plurality of data channels to the serializer 216.

In some embodiments, the serializer 216 can be configured to receive the plurality of data channels processed by the image sensor processor 214. The serializer 216 can combine the plurality of data channels into a single data channel. The serialize 216 can output the image data to the image processing module 204 over the single data channel.

In general, the serializer 216 can multiplex to combine the plurality of data channels into a single high-speed data channel, thereby allowing the camera module 202 to output the image data to the image processing module 204 over a single electrical connection or wire such as the electrical cable 118 of FIGS. 1A-1B instead of over multiple electrical connections with each electrical connection corresponding to a data channel of the plurality of data channels.

In some embodiments, the serializer 216 can generate commands including a clock signal to control the image sensor 212 and the image sensor processor 214. These commands can synchronize data processing operations across the image sensor 212, the image sensor processor 214, and the serializer 216 so that the serializer 216 can properly output the image data captured by the image processing module 204 and processed by the image sensor processor 214 to the image processing module 204.

Figure 3A:
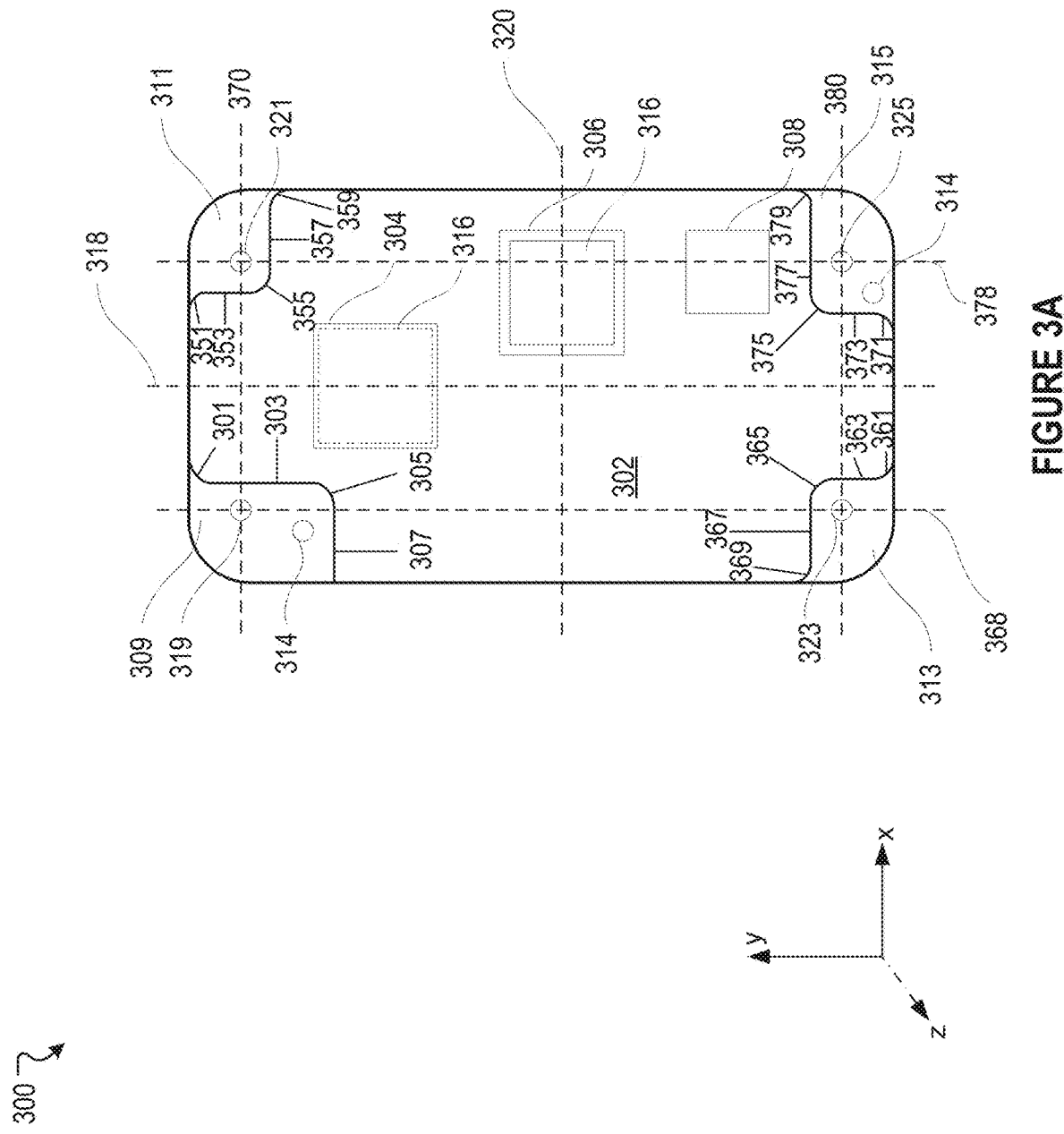
FIG. 3A illustrates a circuit board associated with the camera in accordance with various embodiments of the present inventions.

FIG. 3A illustrates a circuit board 300 associated with the camera 100 in accordance with various embodiments of the present inventions. In some embodiments, the circuit board 300 can be a printed circuit board 302 with one or more exposed surfaces 309, 311, 313, and/or 315 disposed at or near its corners. In some embodiments, the one or more exposed surfaces 309, 311, 313, and/or 315 can be exposed metal, such as copper, surfaces that can facilitate heat dissipation. For example, heat from the printed circuit board 302 can be dissipated or transferred away from the printed circuit board 302 to a heat sink such as the front plate 104 through the one or more exposed surfaces 309, 311, 313, and/or 315. In some embodiments, the printed circuit board 302 can include at least an image sensor 304 such as the image sensor 212 of FIG. 2, an image sensor processor 306 such as the image sensor processor 214 of FIG. 2, and a serializer 308 such as the serializer 216 of FIG. 2. Although not shown in FIG. 3A, the printed circuit board 302 can include other electronic components such as memory such as the non-volatile memory 218 of FIG. 2, resistors, capacitors, and/or inductors associated with the camera 100. In general, the image sensor 304, the image sensor processor 306, the serializer 308, and other active electronic components on the printed circuit board 302 can be powered by a voltage and current supplied to the camera 100 by the electrical cable 118. The image sensor processor 306 may be disposed in between the image sensor 304 and the serializer 308 along a vertical y axis. That is, a y-coordinate of the image sensor processor 306 may be between a y-coordinate of the image sensor 304 and a y-coordinate of the serializer 308. The image sensor processor 306 may be disposed in between the image sensor 304 and the serializer 308 along a horizontal x axis. That is, a x-coordinate of the image sensor processor 306 may be between a x-coordinate of the image sensor 304 and a x-coordinate of the serializer 308.

In some embodiments, the printed circuit board 302 can comprise a plurality of conducting layers such as metal layers separated and insulated by a plurality of non-conducting layers, otherwise known as insulating layers. The plurality of conducting layers can be etched with various conductive tracks or traces that allow electronic components such as the image sensor 304, the image sensor processor 306, and the serializer 308 to transmit and/or receive signals or otherwise communicate with one another. One conducting layer of the plurality of conducting layers can be coupled or connected to the one or more exposed surfaces 309, 311, 313, and/or 315. In this way, heat generated by the electronic components can be dissipated from the printed circuit board 302 to the one or more exposed surfaces 309, 311, 313, and/or 315 through the one conducting layer. The one conducting layer will be discussed in greater detail in reference to FIG. 4A herein.

In some embodiments, the printed circuit board 302 can include a plurality of heat conducting channels or thermal vias. The plurality of heat conducting channels can extend from a depth direction, in a direction parallel to a z-axis, with respect to the electronic components of the printed circuit board 302. In some embodiments, the plurality of heat conducting channels may be disposed corresponding to, or directly underneath, electronic components that dissipate relatively large amounts of heat, and not on every component. In some embodiments, the heat conducting channels may be disposed corresponding to most or all of electronic components. The plurality of heat conducting channels can be metal, such as copper, channels or lines that can be coupled or connected to the one conducting layer of the printed circuit board 302. For example, the plurality of heat conducting channels can extend through a depth of the printed circuit board 302, perpendicular to a surface of the printed circuit board 302 which lies in a x-y plane, on which the electronic components are disposed. The plurality of heat conducting channels may extend through the plurality of conducting and non-conducting layers, to the one conducting layer. When the image sensor 304, the image sensor processors 306, and the serializer 308 are soldered onto their respective locations on the printed circuit board 302, the plurality of heat conducting channels can couple or connect undersides of the image sensor 304, the image sensor processors 306, and the serializer 308 to the one conducting layer. In this way, heat generated by the image sensor 304, the image sensor processors 306, and the serializer 308 can be conducted, transferred, or dissipated away from their respective undersides to the one conducting layer through the plurality of heat conducting channels. This heat can then be conducted away from the one conducting layer to the one or more exposed surfaces 309, 311, 313, and/or 315. The plurality of heat conducting channels will be discussed in greater detail in reference to FIG. 4A herein.

In some embodiments, the printed circuit board 302 can include a thermal compound 316 such as a thermal paste or thermal pad. The thermal compound 316 is a substance that is thermally conductive while electrically insulating. In other words, when applied to an electronic component, the thermal compound 316 can conduct heat generated by the electronic component away from the electronic component to a heat sink while preventing the electronic component from being electrically short-circuited or grounded to the heat sink. In some embodiments, the thermal compound 316 can be applied to the image sensor 304 and the image sensor processors 306, or in some cases, to the serializer 308 to dissipate heat generated by the image sensor 304, the image sensor processors 306, and/or the serializer 308. As shown in FIG. 3A, the thermal compound 316 can be applied to a top side of the image sensor processor 306 to dissipate heat generated by the image sensor process 306 to the front plate 104 of the camera 100 (a heat sink). Also shown in FIG. 3A, the thermal compound 316 can be applied to an underside of the printed circuit board 302 (shown by dotted lines) at a location corresponding to where the image sensor 304 is soldered. The thermal compound 316 applied to the underside of the printed circuit board 302 can help to dissipate heat generated by the image sensor 304 to the back plate 106 of the camera 100. Although not shown in FIG. 3A, in some cases, the thermal compound 316 may be applied to a top side of the serializer 308 to dissipate heat generated by the serializer 308 to the front plate 104 of the camera 100. The thermal compound 316 will be discussed in greater detail in reference to FIG. 4B herein.

In some embodiments, each of the one or more exposed surfaces 309, 311, 313, and/or 315 can include respective installation holes 319, 321, 323, and/or 325. The installation holes 319, 321, 323, and/or 325 can be through holes that can be used to secure or install the printed circuit board 302 to the front plate 104 of the camera 100. For example, mechanical couplers such as screws can be used to secure the printed circuit board 302 to the front plate 104 through each installation hole 319, 321, 323, or 325 of an exposed surface 309, 311, 313, and/or 315. In some embodiments, the installation holes 319 and 323 may be horizontally aligned with the installation holes 321 and 325, respectively. In some embodiments, the installation holes 319 and 321 may be vertically aligned with the installation holes 323 and 325, respectively. For example, the installation hole 319 may be horizontally aligned with the installation hole 321, such that a horizontal plane 370 may traverse or pass through centers of the installation holes 319 and 321. The installation hole 319 may be vertically aligned with the installation hole 323, such that a vertical plane 368 may traverse or pass through centers of the installation holes 319 and 323. The installation hole 321 may be vertically aligned with the installation hole 325, such that a vertical plane 378 may traverse or pass through centers of the installation holes 321 and 325. The installation hole 325 may be horizontally aligned with the installation hole 323, such that a horizontal plane 380 may traverse or pass through centers of the installation holes 323 and 325. In some embodiments, some exposed surfaces of the one or more exposed surfaces 309, 311, 313, and/or 315 can further include an alignment hole 314. For example, as shown in FIG. 3A, the one or more exposed surfaces 309 and 315 disposed on an upper left corner and a lower right corner, respectively, of the printed circuit board 302 can further include the alignment hole 314. The alignment hole 314 can be a through hole that can aid in aligning the image sensor 304 to the lens mount 112 when the printed circuit board 302 is installed into the front plate 104. The alignment hole 314 may be horizontally and vertically offset and unaligned with any of the one or more installation holes 319, 321, 323, and/or 325. As shown, none of the planes 368, 370, 378, or 380 traverse either of the alignment holes 314. The alignment of the image sensor 304 to the lens mount 112 will be discussed in greater detail in reference to FIG. 3B herein.

In some embodiments, as shown in FIG. 3A, contours of each of the exposed surfaces 309, 311, 313, and/or 315 can include a semicircular region flanked by flat regions at respective junctions. For example, the exposed surface 309 may include a semicircular region 305 flanked by flat regions 307 and 303. The exposed surface 309 may further include a curved region 301. A vertical length of the exposed surface 309, along a y-axis and measured from the flat region 307 to a top of the printed circuit board 302 at a termination of the curved region 301, may be greater than respective vertical lengths of the other exposed surfaces 311, 313, and 315. Thus, the exposed surface 309 may extend farther vertically, from a nearest horizontal top edge of the printed circuit board 302, in a direction of the y-axis compared to how far the other exposed surfaces 315, 311, and 313 extend from a nearest horizontal top or bottom edge of the printed circuit board 302. The exposed surface 311 may include a semicircular region 355 flanked by flat regions 357 and 353. The exposed surface 311 may further include curved regions 351 and 359. The exposed surface 313 may include a semicircular region 365 flanked by flat regions 367 and 363. The exposed surface 313 may further include curved regions 361 and 369. The exposed surface 315 may include a semicircular region 375 flanked by flat regions 377 and 373. The exposed surface 315 may further include curved regions 371 and 379. A horizontal length of the exposed surface 315 may be measured along a x-axis and from where the curved region 371 terminates into a bottom of the printed circuit board 302 to a right edge of the printed circuit board where the curved region 379 terminates. The horizontal length of the exposed surface 315 may exceed a horizontal length of the serializer 308. The horizontal length of the exposed surface 315 may also exceed respective horizontal lengths of the other exposed surfaces 309, 311, and 313. Thus, the exposed surface 315 may extend farther horizontally, from a nearest vertical right edge of the printed circuit board 302, in a direction of the x-axis compared to how far the other exposed surfaces 309, 311, and 313 extend from a nearest vertical left or right edge of the printed circuit board 302.

In some embodiments, as shown in FIG. 3A, the image sensor 304 may be disposed along, or centered with respect to, a central vertical axis 318 parallel to a y-axis and bisecting a surface of the printed circuit board 302. The central vertical axis 318 may divide the printed circuit board 302 into two equal portions. The image sensor processor 306 may be disposed along, or centered with respect to, a central horizontal axis 320 parallel to a x-axis and bisecting a surface of the printed circuit board 302. The central horizontal axis 320 may divide the printed circuit board 302 into two equal portions. The central horizontal axis 320 and the central vertical axis 318 may be perpendicular to each other. In some embodiments, the image sensor 304 may be disposed above, or offset from, the central horizontal axis 320, the image sensor processor 306 and the serializer 308 on the printed circuit board 302. In some embodiments, the image sensor processor 306 may be disposed to a right of, or offset from, the central vertical axis 318. In some embodiments, the serializer 308 may be offset from both the central vertical axis 318 and the central horizontal axis 320. Such a placement of the image sensor 304 on the printed circuit board 302 relative to the image sensor processor 306 and the serializer 308 may have many advantages. For example, by placing the image sensor 304 above the image sensor processor 306, any debris that might fall from the thermal compound 316 applied to the image sensor processor 306 would not impede or obstruct a field of view of the image sensor 304. Another advantage of placing the image sensor 304 above the image sensor processor 306 and the serializer 308 is to simplify bus routing and/or trunk routing of the printed circuit board 302. For example, conductive traces on the printed circuit board 302 can be routed in a substantially unidirectional manner in a same plane from the image sensor 304 to the image sensor processors 306 and to the serializer 308 in accordance with the way or sequence image data is collected, processed, and outputted. In this way, distances, such as lengths of the conductive traces, that signals need to travel between the image sensor 304, the image sensor processor 306, and the serializer 308 can be minimized, thereby improving signal integrity.

Figure 3B:
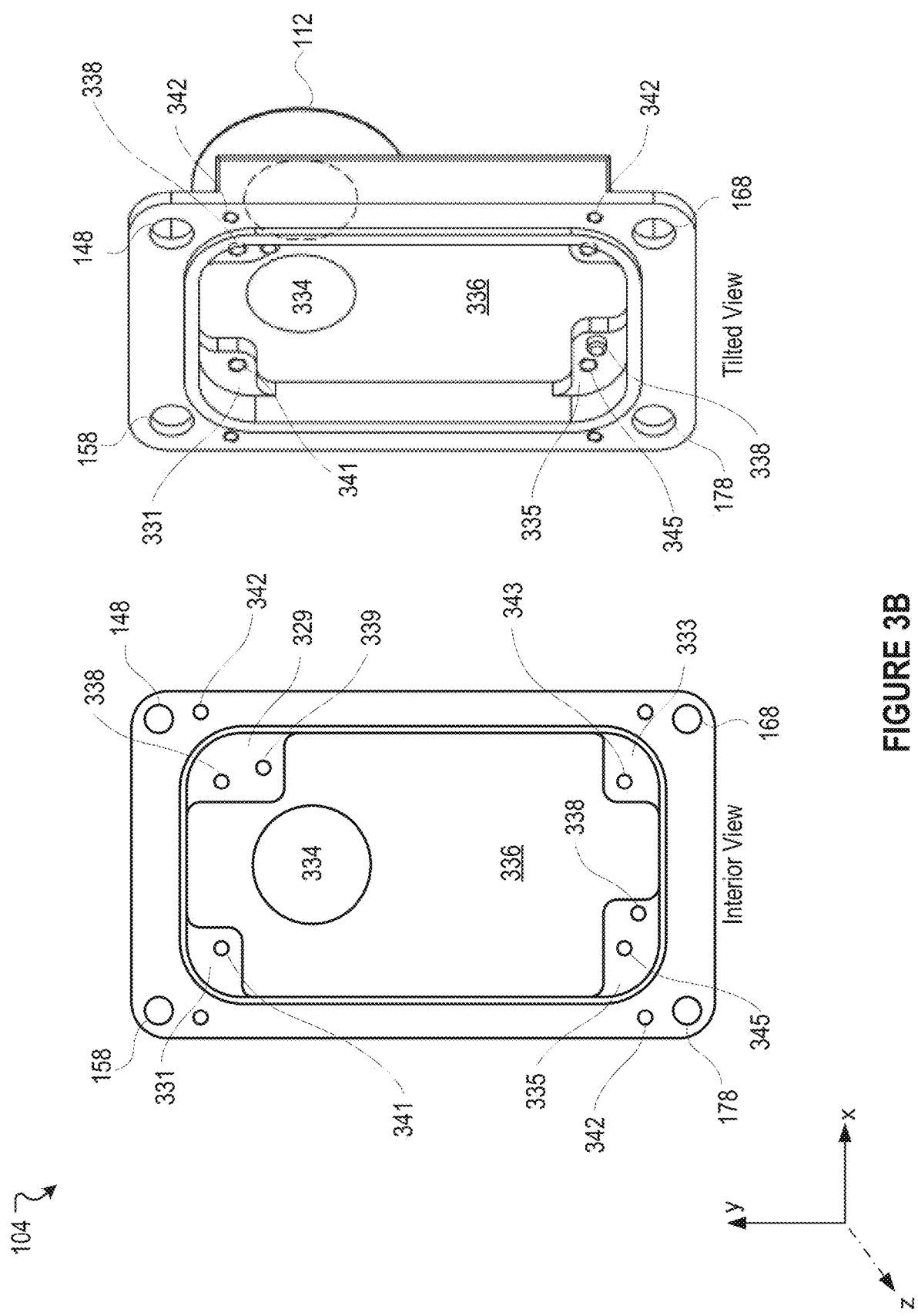
FIG. 3B illustrates a front plate of the camera in accordance with various embodiments of the present inventions.

FIG. 3B illustrates the front plate 104 of the camera 100 in accordance with various embodiments of the present inventions. FIG. 3B provides an interior view and a tilted view of the front plate 104. As shown in FIG. 3B, the front plate 104 can include one or more platforms 329, 331, 333, and/or 335 and a camera barrel 334 on an interior surface 336 of the front plate 104. In some embodiments, the one or more platforms 329, 331, 333, and/or 335 can be raised or offset from the interior surface 336 and can have a shape that substantially mirrors the one or more exposed surfaces 309, 311, 313, and/or 315 of the printed circuit board 302. In this way, when the printed circuit board 302 is installed into the front plate 104, the one or more exposed surfaces 309, 311, 313, and/or 315 contact the one or more platforms 329, 331, 333, and/or 335, thereby maximizing contact and heat dissipation from the printed circuit board 302 to the front plate 104. In some embodiments, the one or more platforms 329, 331, 333, and/or 335 can have a finish that is different from the front plate 104. For example, the one or more platforms 329, 331, 333, and/or 335 can have an exposed metal finish while the front plate 104 can have a protective finish. In some embodiments, the camera barrel 334 can extend outwards from the interior surface 336 to the lens mount 112 of the front plate 104. The camera barrel 334 may be an opening or orifice that allows photons of light to enter the camera 100 through the lens mount 112.

In some embodiments, each of the one or more platforms 329, 331, 333, and/or 335 can include threaded installation holes 339, 341, 343, and/or 345, respectively. Each of the threaded installation holes 339, 341, 343, and/or 345 can be a threaded screw hole that is complementary to each installation hole 319, 321, 323, and 325 of the printed circuit board 302. The threaded installation holes 339, 341, 343, and 345 can be disposed in such a way that when the printed circuit board 302 is placed into the front plate 104, each installation hole 319, 321, 323, and 325 of the printed circuit board 302 lines up with each threaded installation hole 339, 341, 343, and 345, respectively. In this way, mechanical couplers such as screws can be used to secure the printed circuit board 302 to the front plate 104 by tightening the screws though each installation hole 319, 321, 323, and 325 and into each threaded installation hole 339, 341, 343, and 345. In some embodiments, some platforms of the one or more platforms 329, 331, 333, and/or 335 can further include a circuit board alignment pin 338. For example, as shown in FIG. 3B, the one or more platforms 329 and 335 disposed near an upper right corner and a lower left corner of the front plate 104 can include the circuit board alignment pin 338. The circuit board alignment pin 338 is a protruding pin that is complementary to the alignment hole 314 of the printed circuit board 302. The alignment holes 314 may be offset vertically and horizontally from each installation hole 319, 321, 323, and 325. When the printed circuit board 302 is placed onto the front plate 104, each alignment hole 314 of the printed circuit board 302 is disposed directly over each circuit board alignment pin 338. In this way, an alignment of the image sensor 304 to the camera barrel 334 can be fixed by affixing a spatial relationship between the printed circuit board 302 to the front plate 104. In some embodiments, the circuit board alignment pin 338 can provide alignment stability by holding the printed circuited board 302 in place while the camera 100 experiences shock or vibration. For example, screws holding down the printed circuit board 302 to the front plate 104 may become loose over time. In this example, because the circuit board alignment pin 338 "locks" or holds in place the printed circuit board 302, any loosening of the screws would not alter the alignment of the image sensor 304 to the camera barrel 334.

In some embodiments, the front plate 104 can include one or more camera housing assembly holes 342. The one or more camera housing assembly holes 342 are threaded holes that can be used to assemble the front plate 104 and the back plate 106 to form the camera housing 102. For example, after the printed circuit board 302 has been installed into the front plate 104, the front plate 104 and the back plate 106 can be assembled and secured by tightening screws through the back plate 106 and into the one or more camera assembly holes 342.

Figure 3C:
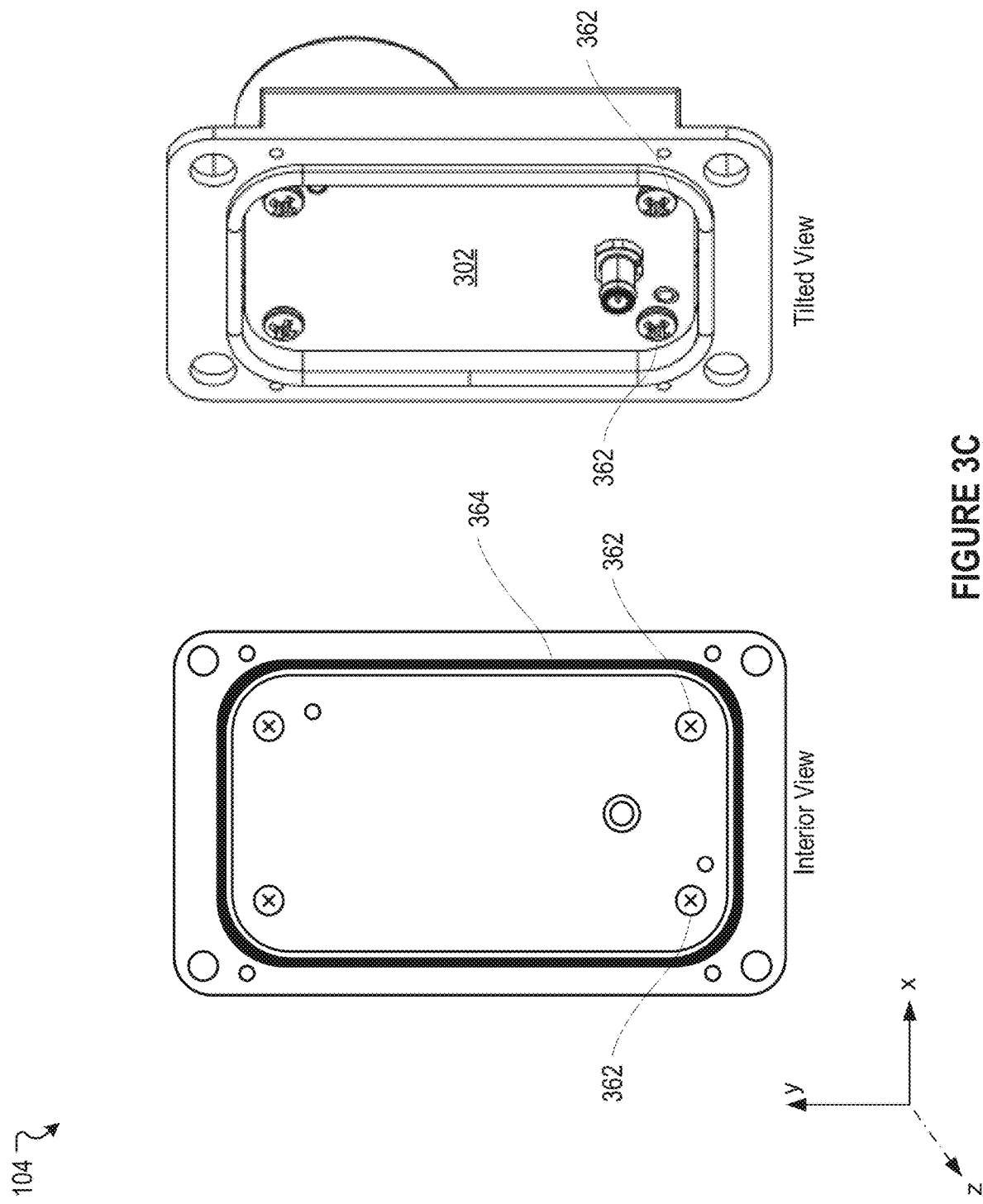
FIG. 3C illustrates the front plate of the camera with a printed circuit board installed in accordance with various embodiments of the present inventions.

FIG. 3C illustrates the front plate 104 of the camera 100 with the printed circuit board 302 installed in accordance with various embodiments of the present inventions. FIG. 3C provides an interior view and a tilted view of the front plate 104 with the printed circuit board 302 installed. In FIG. 3C, the printed circuit board 302 has been installed, mounted, or secured into the front plate 104 with one or more screws 362 through each installation hole 319, 321, 323, and 325 of the printed circuit board 302 and into to each threaded installation hole 339, 341, 343, and 345. In some embodiments, the front plate 104 can include a camera housing gasket 364, which may be implemented as the camera housing gasket described with respect to FIGS. 1A-1B. The camera housing gasket 364 can be a rubber gasket that can fill spacings or gaps between the front plate 104 and the back plate 106. As discussed, the camera housing gasket 364 can prevent debris such as water, rain, dust, etc. from entering the camera housing 102 and contaminating the printed circuit board 302 thereafter.

Figure 4A:
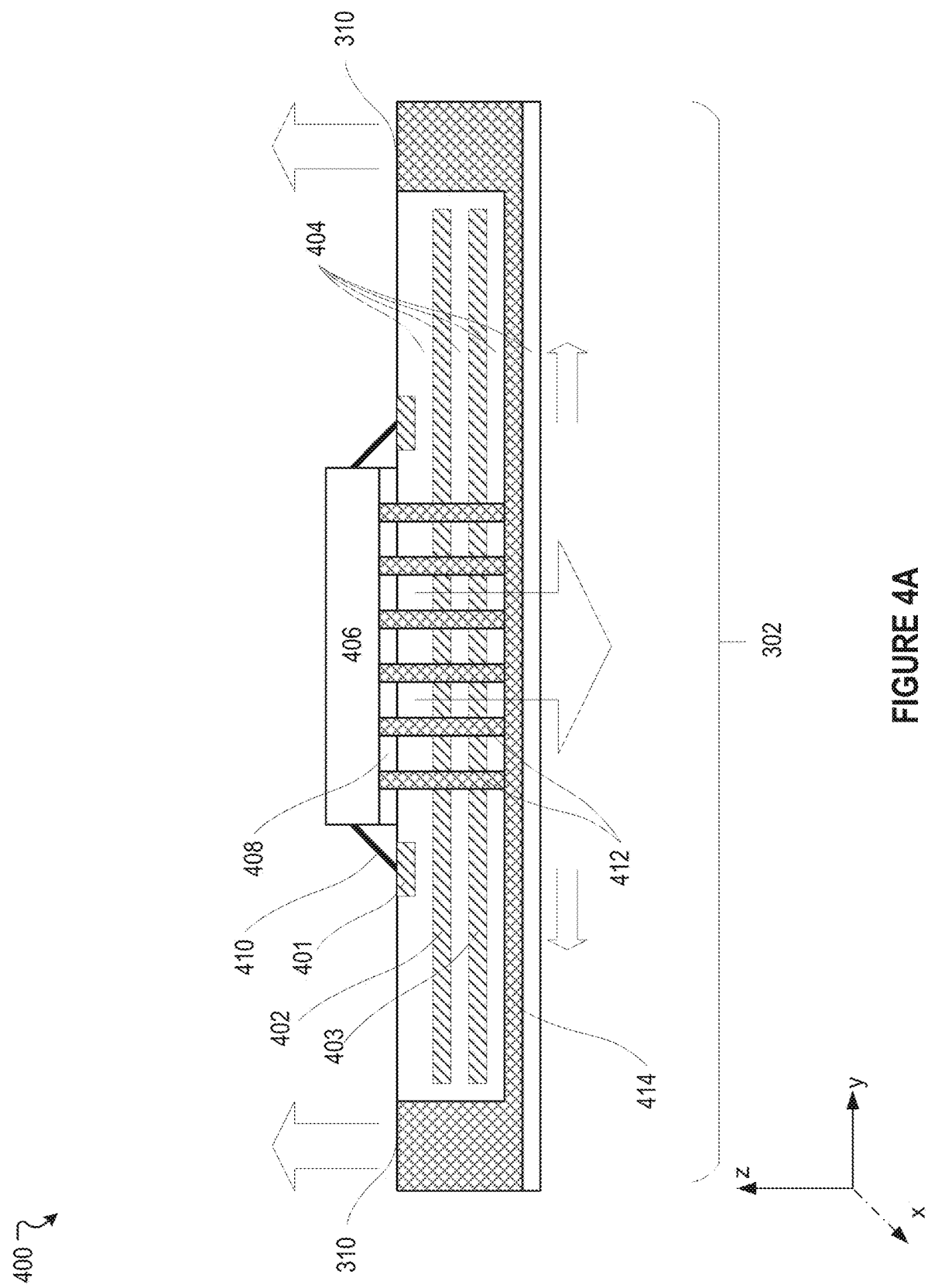
FIG. 4A illustrates a cross-sectional view of the printed circuit board of the camera in accordance with various embodiments of the present inventions.

FIG. 4A illustrates a cross-sectional view 400 of the printed circuit board 302 of the camera 100 in accordance with various embodiments of the present inventions. In some embodiments, the printed circuit board 302 can comprise a plurality of conducing layers 401, 402, and 403 which may be implemented as the plurality of conducting layers of FIG. 3A. The plurality of conducting layers 401, 402, and 403 may be separated and insulated by a plurality of non-conducting layers 404 which may be implemented as the plurality of non-conducting layers of FIG. 3A. The plurality of conducting layers 401, 402, and 403 can be metal layers that conduct electric signals between electronic components of the printed circuit board 302. For example, the plurality of conducting layers 401, 402, and 403 can be copper layers. The plurality of conducting layers 401, 402, and 403 can include etchings of conductive tracks or traces that route the electric signals between the electronic components. The plurality of non-conducting layers 404 are insulating layers that do not conduct electric signals. For example, the plurality of non-conducting layers 404 can be laminated fiberglass-epoxy layers.

In some embodiments, an electronic component 406, such as the image sensor 304, the image sensor processor 306, or the serializer 308 of FIG. 3A, can be surface mounted to the printed circuit board 302 via an adhesive 408 or bond. The electronic component 406 can be soldered 410 onto the printed circuit board 302 to transmit and/or receive signals or otherwise communicate with other electronic components on the printed circuit board 302 through the plurality of conducting layers 401, 402, and 403. In some embodiments, the printed circuit board 302 can include a plurality of heat conducting channels 412 or thermal vias such as the plurality of heat conducting channels of FIG. 3A. The plurality of heat conducting channels 412 are channels that can extend from underneath the electronic component 406. In some embodiments, as shown in FIG. 4A, the plurality of heat conducting channels 412 can be metal, such as copper, channels that run from a top to a bottom of the printed circuit board 302, through the plurality of conducting layers 401, 402, and 403 and the plurality of non-conducting layers 404. The plurality of heat conducting channels 412 can be coupled or connected to an underside of the electronic component 406 to dissipate heat generated by the electronic component 406. For example, the image sensor processor 306 can generate heat when processing image data captured by the image sensor 304. In this example, thermal vias disposed underneath the image sensor processor 306 can dissipate or transfer the heat generated by the image sensor processor 306 away from the image sensor processor 306. In general, the plurality of heat conducting channels 412 can be electrically and thermally insulated from the plurality of conducting layers 401, 402, and 403. In this way, the plurality of heat conducting channels 412 do not interfere with signal transmissions occurring on the plurality of conducting layers 401, 402, and 403.

In some embodiments, one conductive layer 414 of the plurality of conductive layers 401, 402, and 403, which may be implemented as the one conductive layer of FIG. 3A, can be coupled or connected to the plurality of heat conducting channels 412. The one conductive layer 414 is generally disposed toward the bottom of the printed circuit board 302. The one conductive layer 414 can be electrically insulated from the other conductive layers of the plurality of conductive layers 401, 402, and 403 and does not conduct electrical signals. The one conductive layer 414 can provide a thermal pathway to further transfer or dissipate the heat generated by the electronic component 406. For example, in some embodiments, the one conductive layer 414 can be further coupled or connected to exposed surfaces 310 of the printed circuit board 302, which may be implemented as any two of the one or more exposed surfaces 309, 311, 313, and 315 of FIG. 3A. In this example, the heat generated by the electronic component 406 can be dissipated from the electronic component 406 to the exposed surfaces 310 through the plurality of heat conducting channels 412 and the one conductive layer 414.

Figure 4B:
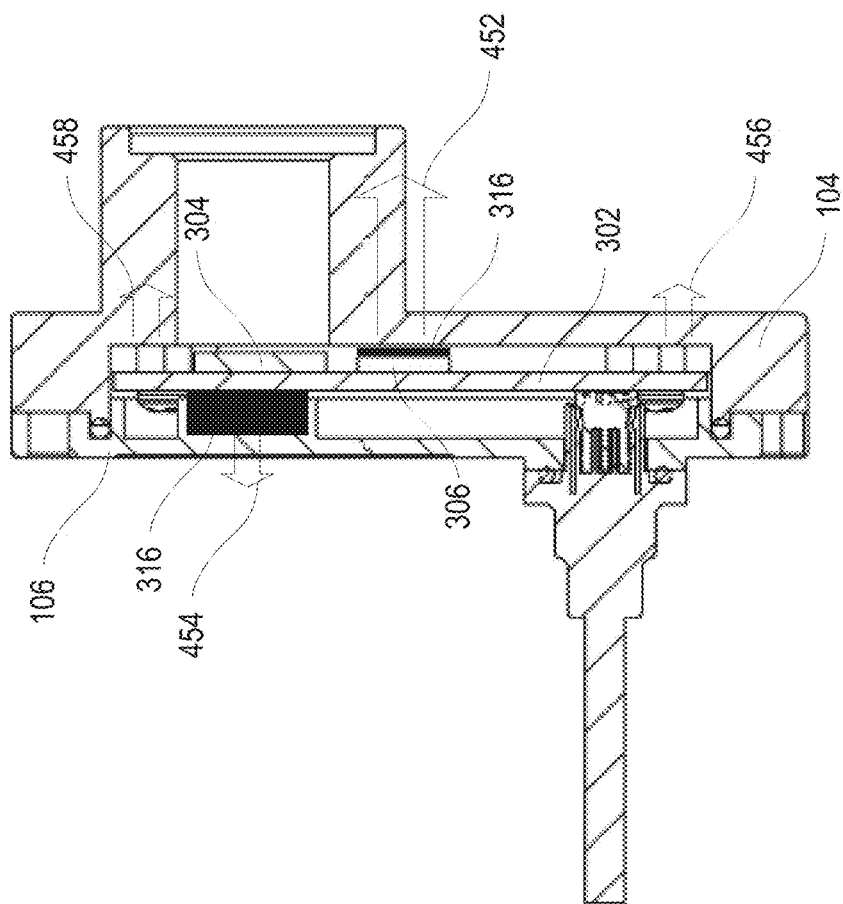
FIG. 4B illustrates a cross-sectional view of the camera in accordance with various embodiments of the present inventions.

FIG. 4B illustrates a cross-sectional view 450 of the camera 100 in accordance with various embodiments of the present inventions. As shown in FIG. 4B, the printed circuit board 302 can be installed to the front plate 104 and disposed between the front plate 104 and the back plate 106 of the camera 100. The printed circuit board 302 can further include a thermal compound 316. The thermal compound 316 can be applied to a top surface of the image sensor processor 306 and an underside surface of the printed circuit board 302 at or corresponding to a location where the image sensor 304 is surface mounted. In some embodiments, a size and/or shape of the thermal compound 316 may match a size of the image sensor 304 and/or the image sensor processor 306. In other embodiments, a size of the thermal compound 316 may be less than a size of the image sensor 304 and/or the image sensor processor 306. The thermal compound 316 can help dissipate heat generated by the image sensor processor 306 through direct conduction to the front plate 104, as indicated by arrow 452. The thermal compound 316 can help dissipate heat generated by the image sensor 304 through direct conduction from the underside of the printed circuit board 302 to the back plate 106, as indicated by arrow 454. In addition, the plurality of heat conducting channels 412 disposed underneath the image sensor 304 and the image sensor processor 306 can further dissipate the heat to the front plate 104 through the one conductive layer 414 and the one or more exposed surfaces 309, 311, 313, and 315 of the printed circuit board 302, as indicated by arrows 456 and 458.

Figure 4C:
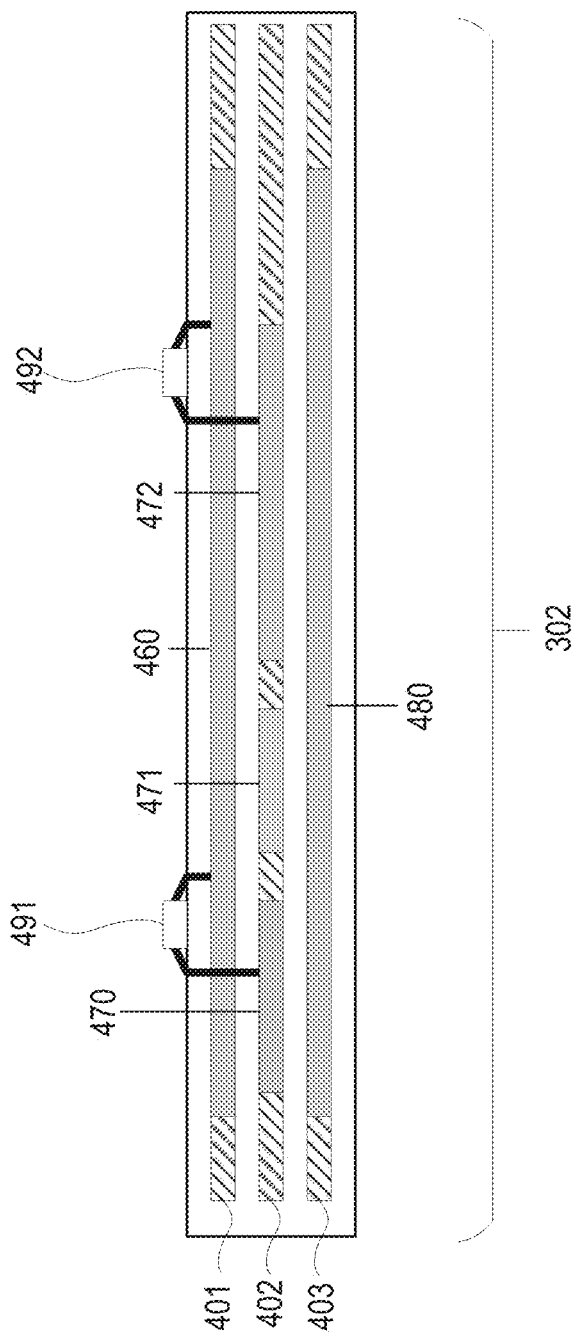
FIG. 4C illustrates a cross-sectional view of the printed circuit board of the camera in accordance with various embodiments of the present inventions.

FIG. 4C illustrates a cross-sectional view of the printed circuit board 302 of the camera 100, showing a mechanism of improving power transmission. In some embodiments, as shown in FIG. 4C, some conducting layers of the plurality of conducting layers, such as the conducting layer 402, can include power planes 470, 471, and 472. In general, power planes are metal layers embedded in the plurality of conducting layers. These power planes are dedicated to carrying power (e.g., voltage and current) needed to operate electronic components of the printed circuit board 302. For example, a power plane of a conducting layer can be configured to carry 2.8 volts and deliver this 2.8 volts to the image sensor 304 through conductive traces of the conducting layer. In some examples, the conducting layer 402 may include power planes 470, 471, and 472 which may be configured to carry 2.8 volts, 1.2 volts, and 0.9 volts, respectively. In some embodiments, some conducting layers of the plurality of conducting layers, such as the conducting layers 401 and 403, can include dedicated ground planes such as ground planes 460 and 480. Similar to the power planes, the ground planes are metal layers embedded in the plurality of conducting layers that are dedicated to being electric grounds. In some embodiments, the printed circuit board 302 can be configured such that a power plane of a conducting layer is disposed between two ground planes of two conducting layers as shown in FIG. 4C. For example, the power planes 470, 471, and 472 may be disposed between two ground planes 460 and 480. Such a configuration can improve high frequency response of electronic components. For example, placing a power plane of a conducting layer between two ground planes reduces parasitic inductance associated with decoupling capacitors such as decoupling capacitors 491 and 492, thereby ensuring smooth delivery of power from the power planes 470, 471, and 472 to electronic components. The ground planes 460 and 480 may be oversized to exceed a combined surface area of at least one of, or all of, the power planes 470, 471, and 472. The decoupling capacitors 491 and 492 may be coupled to the ground plane 460 at one terminal and to the power planes 470 and 472 at the other terminal, respectively. The decoupling capacitors 491 and 492 may be disposed in parallel and 180 degrees out of phase, or opposite polarity, from each other. The decoupling capacitors 491 and 492 may be connected by a large piece of the power plane 472 rather than being connected by traces. Connecting the decoupling capacitors with a large piece further reduces parasitic inductances. In this way, high frequency signals (e.g., high speed signals) may be allocated to conducting layers that include power planes and being "sandwiched" by two ground planes to allow for better camera electrical performance such as having a better ISO performance (e.g., sensitivity to light).

FIG. 5 illustrates a sensor structure 500 of an autonomous vehicle in accordance with various embodiments of the present inventions. In some embodiments, the sensor structure 500 can include a light detection and ranging (LiDAR) sensor 502 and a plurality of cameras 504. The plurality of cameras 504 can be implemented with the camera 100 of FIGS. 1A-1B. As discussed in reference to FIGS. 1A-1B, the plurality of cameras 504 generally have a tall and slim profile that allows the plurality of cameras 504 to be arranged in a compact arrangement. Such an arrangement allows the plurality of cameras 504 to have similar field of views and thereby simplifying camera alignment. In some embodiments, the plurality of cameras 504 can include an enhancement apparatus 506 attached to the cameras 504 via threaded holes at the top of the front plate 104. The threaded holes may comprise M3 threaded holes. As discussed in reference to FIGS. 1A-1B, the enhancement apparatus 506 can provide additional capability or function to the plurality of cameras 504. For example, the enhancement apparatus 506 can be a lens cleaning apparatus such as a cleaning nozzle that could rotate about the enhancement apparatus 506. As another example, the enhancement apparatus 506 can additionally or alternatively include a neural filter apparatus that alters transmittance of light captured by the plurality of cameras 504. As another example, the enhancement apparatus 506 can additionally or alternatively include a polarizer, or a diffractor.

In some embodiments, the sensor structure 500 may further comprise a processor 508 that determines torques applied by a mechanical coupler or fastener such as a screw, nut and bolt, or pin at one or more mounting holes and/or alignment holes associated with the plurality of cameras 504. In response to the processor 508 determining that a torque applied by at least one mechanical coupler or fastener deviates, by more than a threshold amount, from torques by the other mechanical couplers or fasteners, the processor 508 may output an alarm and/or command a vehicle such as an autonomous vehicle to slow down. The processor 508 may determine a maximum speed of the vehicle such that a vibration or movement of any of the cameras 504 would not exceed a threshold vibration or movement based on the applied torques of the mechanical couplers or fasteners, and output such a command to a separate controller that controls steering, braking, or driving components of the vehicle based on the determined maximum speed. The processor 508 may include an artificial intelligence (AI) processor that predicts a vibration or movement of any of the cameras 504 based on a speed of the vehicle and/or other road conditions such as a bumpiness, which may be measured by an International Roughness Index (IRI). The AI processor may be trained by previous inputs of vehicle speed, road conditions, torques applied, and outputs of amounts of vibration of cameras corresponding to the inputs. The AI processor may predict a maximum vehicle speed under current parameters such as predicted road conditions of a current road and current torques applied, such that a predicted vibration of any of the plurality of cameras 504 does not exceed the threshold vibration. For example, the processor 508 may output a command to a controller, which may control the vehicle to stay within the determined maximum speed during an entire duration of the route, or only exceed the determined maximum speed in certain emergency situations.

In some embodiments, the processor 508 may determine that a torque applied by at least one mechanical coupler or fastener is lower than a threshold torque. The threshold torque may be a minimum torque, at a given vehicle speed and/or road conditions, such that the vibration of any of the plurality of cameras 504 would not exceed a threshold vibration. In response to such a determination, the processor 508 may output an alarm and/or command the vehicle to slow down. The processor 508 may determine a maximum speed such that a vibration or movement of any of the plurality of cameras 504 would not exceed a threshold vibration or movement based on the current applied torques of the mechanical couplers or fasteners, and output a command to a controller, which may control the vehicle based on the determined maximum speed. In some embodiments, prior to the vehicle starting a route, the processor 508 may estimate or determine a predicted bumpiness or other driving conditions of the route, such as an IRI, and determine whether the mechanical couplers or fasteners are tightened adequately such that an amount of vibration or movement of any of the plurality of cameras 504 would not exceed a threshold vibration or movement during the route. The predicted bumpiness or other driving conditions of the route may be obtained using satellite maps, historical data, or other data. Upon a negative determination, the processor 508 may output a warning and/or a predicted amount by which one or more of the mechanical coupler or fastener should be tightened.

The techniques described herein, for example, are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination.

Figure 6:
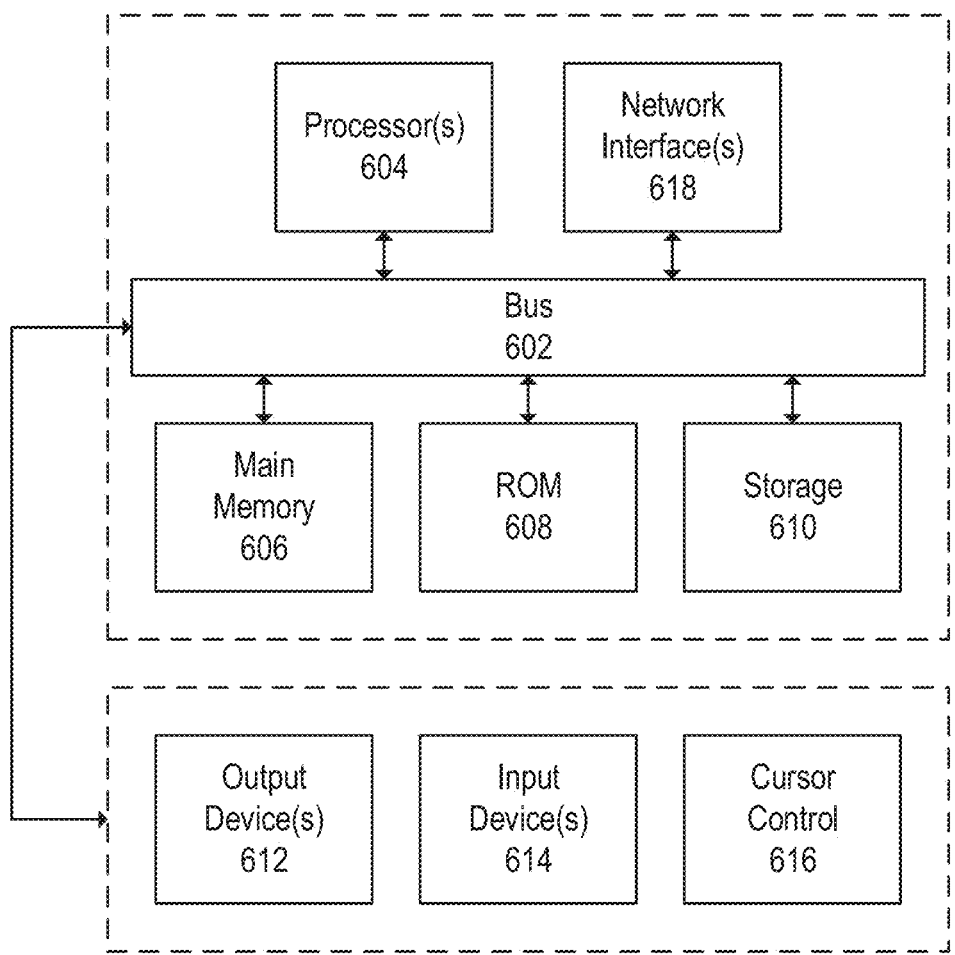
FIG. 6 is a schematic block diagram of a computer system upon which any of the embodiments described herein may be implemented.

FIG. 6 is a block diagram that illustrates a computer system 600 upon which any of the embodiments described herein may be implemented. The computer system 600 includes a bus 602 or other communication mechanism for communicating information, one or more hardware processors 604 coupled with bus 602 for processing information. A description that a device performs a task is intended to mean that one or more of the hardware processor(s) 604 performs.

The computer system 600 also includes a main memory 606, such as a random access memory (RAM), cache and/or other dynamic storage devices, coupled to bus 602 for storing information and instructions to be executed by processor 604. Main memory 606 also may be used for storing temporary variables or other intermediate information during execution of instructions to be executed by processor 604. Such instructions, when stored in storage media accessible to processor 604, render computer system 600 into a special-purpose machine that is customized to perform the operations specified in the instructions.

The computer system 600 further includes a read only memory (ROM) 608 or other static storage device coupled to bus 602 for storing static information and instructions for processor 604. A storage device 610, such as a magnetic disk, optical disk, or USB thumb drive (Flash drive), etc., is provided and coupled to bus 602 for storing information and instructions.

The computer system 600 may be coupled via bus 602 to output device(s) 612, such as a cathode ray tube (CRT) or LCD display (or touch screen), for displaying information to a computer user. Input device(s) 614, including alphanumeric and other keys, are coupled to bus 602 for communicating information and command selections to processor 604. Another type of user input device is cursor control 616. The computer system 600 also includes a communication interface 618 coupled to bus 602.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural referents unless the context clearly dictates otherwise. The phrases "at least one of," "at least one selected from the group of," or "at least one selected from the group consisting of," and the like are to be interpreted in the disjunctive (e.g., not to be interpreted as at least one of A and at least one of B).

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiment.

A component being implemented as another component may be construed as the component being operated in a same or similar manner as the another component, and/or comprising same or similar features, characteristics, and parameters as the another component.

As used herein, the term "or" may be construed in either an inclusive or exclusive sense. Moreover, plural instances may be provided for resources, operations, or structures described herein as a single instance. Additionally, boundaries between various resources, operations, program modules, engines, and/or datastores are somewhat arbitrary, and particular operations are illustrated in a context of specific illustrative configurations. Other allocations of functionality are envisioned and may fall within a scope of various embodiments of the invention. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the invention as represented by the appended claims. The specification and drawings are, accordingly, to be regarded in an illustrative rather than a restrictive sense.

The computer readable storage medium is a form of non-transitory media, as that term is used herein, and can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. The computer readable storage medium, and non-transitory media more generally, may include non-volatile media and/or volatile media. A non-exhaustive list of more specific examples of a computer readable storage medium includes the following: a portable computer diskette such as a floppy disk or a flexible disk; a hard disk; a random access memory (RAM), a read-only memory (ROM), an erasable programmable read-only memory (EPROM or Flash memory), a static random access memory (SRAM), or any other memory chip or cartridge; a portable compact disc read-only memory (CD-ROM); a digital versatile disk (DVD); a memory stick; a solid state drive; magnetic tape or any other magnetic data storage medium; a mechanically encoded device such as punch-cards or raised structures in a groove having instructions recorded thereon or any physical medium with patterns of holes; any networked versions of the same; and any suitable combination of the foregoing.

Non-transitory media is distinct from transmission media, and thus, a computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Non-transitory media, however, can operate in conjunction with transmission media. In particular, transmission media may participate in transferring information between non-transitory media. For example, transmission media can include coaxial cables, copper wire, and/or fiber optics, including the wires that include at least some of the bus(es). Transmission media can also take the form of acoustic or light waves, such as those generated during radio-wave and infra-red data communications.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider (ISP)). In some embodiments, electronic circuitry including, for example, programmable logic circuitry, FPGAs, or programmable logic arrays (PLA) may execute the computer readable program instructions by utilizing state information of the computer readable program instructions to personalize the electronic circuitry, in order to perform aspects of the present invention.

The invention claimed is:
1. A sensor device comprising:
a housing; and
a printed circuit board encased by the housing, wherein the printed circuit board comprises:
an image sensor that captures image data;
an image sensor processor that processes the image data;
a serializer that converts one or more data channels associated with the image data into a single data channel;
one or more exposed surfaces that transfer heat generated by the image sensor, the image sensor processor, and the serializer to the housing;

a plurality of conducting layers that conduct signals associated with the image sensor, the image sensor processor, and the serializer;

a plurality of non-conducting layers disposed between the plurality of conducting layers, wherein the plurality of non-conducting layers insulate the plurality of conducting layers; and a plurality of heat conducting channels disposed underneath the image sensor, the image sensor processor, and the serializer, the plurality of heat conducting channels being coupled to a conducting layer of the plurality of conducting layers, and wherein the conducting layer is insulated from other conducting layers of the plurality of conducting layers.

2. The sensor device of claim 1, wherein the housing comprises a front plate and a back plate, and the printed circuit board is secured to the front plate of the housing.

3. The sensor device of claim 1, wherein the one or more exposed surfaces are disposed at each corner of the printed circuit board.

4. The sensor device of claim 3, wherein each of the one or more exposed surfaces includes a through hole, the through hole being an installation hole.

5. The sensor device of claim 4, wherein the printed circuit board is secured to a front plate of the housing through mechanical fasteners at the one or more exposed surfaces.

6. The sensor device of claim 3, wherein at least one of the exposed surfaces include a second through hole, the second through hole being an alignment hole.

7. The sensor device of claim 1, wherein the printed circuit board further comprises:

a plurality of conducting layers that conduct signals associated with the image sensor, the image sensor processor, and the serializer; and a plurality of non-conducting layers disposed between the plurality of conducting layers, wherein the plurality of non-conducting layers insulate the plurality of conducting layers.

8. The sensor device of claim 1, wherein the conducting layer is coupled to the one or more exposed surfaces of the printed circuit board.

9. The sensor device of claim 1, wherein the plurality of heat conducting channels comprise copper channels.

10. The sensor device of claim 1, wherein the printed circuit board further comprises:

a thermal compound that transfers the heat generated by the image sensor, the image sensor processor, and the serializer from the printed circuit board to the housing.

11. The sensor device of claim 1, wherein the image sensor is disposed on the printed circuit board and:

centered with respect to a central vertical axis that bisects a surface of the printed circuit board; and offset from a central horizontal axis that bisects the surface of the printed circuit board and is perpendicular to the central vertical axis.

12. The sensor device of claim 1, wherein the image sensor processor is disposed on the printed circuit board and:

centered with respect to a central horizontal axis that bisects the surface of the printed circuit board; and offset from a central vertical axis that bisects the surface of the printed circuit board and is perpendicular to the central horizontal axis.

13. The sensor device of claim 1, wherein the serializer is disposed on the printed circuit board and:

offset from a central vertical axis that bisects a surface of the printed circuit board; and offset from a central horizontal axis that bisects a surface of the printed circuit board and is perpendicular to the central vertical axis.

14. A sensor device comprising:

a housing; and a printed circuit board encased by the housing, wherein the printed circuit board comprises:

an image sensor that captures image data;

an image sensor processor that processes the image data;

a serializer that converts one or more data channels associated with the image data into a single data channel;

one or more exposed surfaces that transfer heat generated by the image sensor, the image sensor processor, and the serializer to the housing;

a plurality of conducting layers that conduct signals associated with the image sensor, the image sensor processor, and the serializer;

a plurality of non-conducting layers disposed between the plurality of conducting layers, wherein the plurality of non-conducting layers insulate the plurality of conducting layers; and a plurality of heat conducting channels disposed underneath the image sensor, the image sensor processor, and the serializer, the plurality of the heat conducting channels being insulated from the plurality of conducting layers.

15. A sensor device comprising:

a housing; and a printed circuit board encased by the housing, wherein the printed circuit board comprises:

an image sensor that captures image data;

an image sensor processor that processes the image data;

a serializer that converts one or more data channels associated with the image data into a single data channel;

one or more exposed surfaces that transfer heat generated by the image sensor, the image sensor processor, and the serializer to the housing;

a thermal compound that transfers the heat generated by the image sensor, the image sensor processor, and the serializer from the printed circuit board to the housing, wherein the thermal compound:

is applied to a bottom surface of the printed circuit board at a location corresponding to the image sensor, the thermal compound contacting a back plate of the housing;

is applied atop a surface of the image sensor processor, the thermal compound contacting a front plate of the housing; or is applied atop a surface of the serializer, the thermal compound contacting a front plate of the housing.

* * * * *